(12) United States Patent
Veluri et al.

(10) Patent No.: US 12,713,157 B2
(45) Date of Patent: Aug. 18, 2026

(54) ANALOG CORRELATED MULTI-SAMPLING TECHNIQUES

(71) Applicant: SEMICONDUCTOR COMPONENTS INDUSTRIES, LLC, Scottsdale, AZ (US)

(72) Inventors: Shiva Shanthan Veluri, Bangalore (IN); Bharat Balar, Bengaluru (IN); Gurvinder Singh, Bangalore (IN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 35 days.

(21) Appl. No.: 18/948,883

(22) Filed: Nov. 15, 2024

(65) Prior Publication Data

US 2026/0143260 A1 May 21, 2026

(51) Int. Cl.
*H04N 25/772* (2023.01)
*H03M 1/08* (2006.01)
*H04N 25/78* (2023.01)

(52) U.S. Cl.
CPC ............ *H04N 25/772* (2023.01); *H03M 1/08* (2013.01); *H04N 25/78* (2023.01)

(58) Field of Classification Search
CPC .......... H04N 25/78; H03F 2203/45134; H03F 2203/45156; H03F 2203/45171; H03F 2203/45514; H03F 2203/45551; H03F 3/45475
See application file for complete search history.

(56) References Cited

U.S. PATENT DOCUMENTS

| | | | |
|---|---|---|---|
| 5,793,322 A | 8/1998 | Fossum et al. | |
| 8,547,270 B1 | 10/2013 | Strode | |
| 11,722,794 B2 | 8/2023 | Innocent et al. | |
| 2006/0055577 A1 | 3/2006 | Boemler | |
| 2008/0303700 A1* | 12/2008 | Tsuchi .................... | H03F 1/083 341/122 |

(Continued)

OTHER PUBLICATIONS

German Patent and Trademark Office Search Report and Preliminary Opinion of Patentability for Application No. 10 2025 104 259.4 dated Jul. 28, 2025 (8 pages).

(Continued)

*Primary Examiner* — Amy R Hsu
(74) *Attorney, Agent, or Firm* — KW Law, LLP

(57) ABSTRACT

Systems, devices, and methods relating to analog-to-digital converters (ADCs) having a split digital-to-analog converters (DAC) are described. The ADC may include sample and hold circuitry having multiple sample and hold branches, with each branch coupled to a separate DAC. The total capacitor area for all of the separate DACs in the ADC may sum to the total capacitor area required in a non-branched ADC configuration. Exemplary ADCs may enable analog correlated multi-sampling to reduce noise or otherwise improve signal-to-noise ratio. The ADC may include a configurable gain factor and a configurable number of correlated multi-sampling reads. Exemplary embodiments include an image sensor having a pixel output coupled with a readout circuitry, wherein the readout circuitry includes an ADC having a split-DAC architecture, enabling lower read noise and higher framerates with lower power usage.

20 Claims, 5 Drawing Sheets

(56) References Cited

U.S. PATENT DOCUMENTS

| | | | | |
|---|---|---|---|---|
| 2013/0194118 | A1 * | 8/2013 | Coln | H03M 1/124 341/155 |
| 2016/0099269 | A1 * | 4/2016 | Huang | G11C 27/026 250/206 |
| 2017/0171483 | A1 | 6/2017 | Kudoh et al. | |
| 2017/0230599 | A1 * | 8/2017 | Abiru | H03M 1/56 |
| 2019/0313042 | A1 | 10/2019 | Janbu et al. | |
| 2020/0210020 | A1 * | 7/2020 | Lee | G06F 3/044 |

OTHER PUBLICATIONS

Seo et al. "A Low-Noise High Intrascene Dynamic Range CMOS Image Sensor with a 13 to 19b Variable-Resolution Column-Parallel Folding-Integration/Cyclic ADC," IEEE Journal of Solid State Circuits, vol. 47, No. 1, Jan. 2012 (12 pages).

Boukhayma et al. "A Correlated Mutliple Sampling Passive Switched Capacitor Circuit for Low Light CMOS Image Sensors," 2015 International Conference on Noise and Fluctuations (ICNF), downloaded May 4, 2024 from IEEE Xplore (4 pages).

* cited by examiner

ANALOG CORRELATED MULTI-SAMPLING TECHNIQUES

BACKGROUND

This application relates generally to image sensors and, more particularly, to improved techniques for reading the output of pixels in low-noise and high-speed image sensors.

Low-noise, high-speed image sensors are used in a variety of applications. For example, in automotive and industrial applications, the sensor's ability to capture fast-moving subjects in a variety of lighting conditions facilitates accurate object recognition. Such sensors may also be for applications such as high-speed photography and videography, machine vision, surveillance systems, scientific research, and the like. The integration of such sensors into various systems leads to improvements in performance, reliability, and usability across a variety of such applications.

Image sensors often include an array of pixel sensors, referred to as pixels, which may be arranged into rows and columns. An image sensor may convert the pixel output to image data by reading out rows of pixels and converting the pixel signals to image data using a column signal chain. The column signal chains may include electronic circuitry associated with each column of pixels in the pixel array. The column signal chain typically includes components such as amplifiers, analog-to-digital (ADC) converters, noise reduction circuitry, and the like, which operate to convert the raw pixel data into a processed digital data that can be used to create a digital image.

Low-noise image sensors require low dark noise and higher analog gain from the column signal chain, for example to improve object detection in low or very low light conditions. For example, high dynamic range (HDR) image sensors rely on low read noise and high analog gains to improve the detail of resulting images in low light conditions. In general, the higher gain in the column signal chain helps mitigate any non-linearities and/or imperfections further down the signal chain, such as in the ADC, circuitry implementing various image-related algorithms, or the like.

Read noise in low light conditions may be contributed by the noise of the pixel source follower, current sources, column amplifier, and column ADC. Band-limiting the noise at the input of the ADC with a big load capacitor at the output of the amplifier may help reduce thermal-related noise, but also leads to lower frame rates. Further, flicker noise due to the source follower is not reduced.

Alternatively, or additionally, digital correlated multi-sampling (CMS) techniques can be used to average the source follower flicker noise, high frequency thermal noise left over after band-limiting, and column ADC noise such as reset noise (also referred to as KTC noise), quantization noise, and comparator noise. Digital CMS techniques require extra reads for digital averaging. For example, digital double CMS operations require one additional sampling and conversion. The extra required reads increase the power required to perform readout operations and reduce the achievable frame rate.

It would therefore be desirable to provide improved devices and methods for operating low-noise and high-speed image sensors.

BRIEF DESCRIPTION OF DRAWING FIGURES

BRIEF SUMMARY

Figure 1:
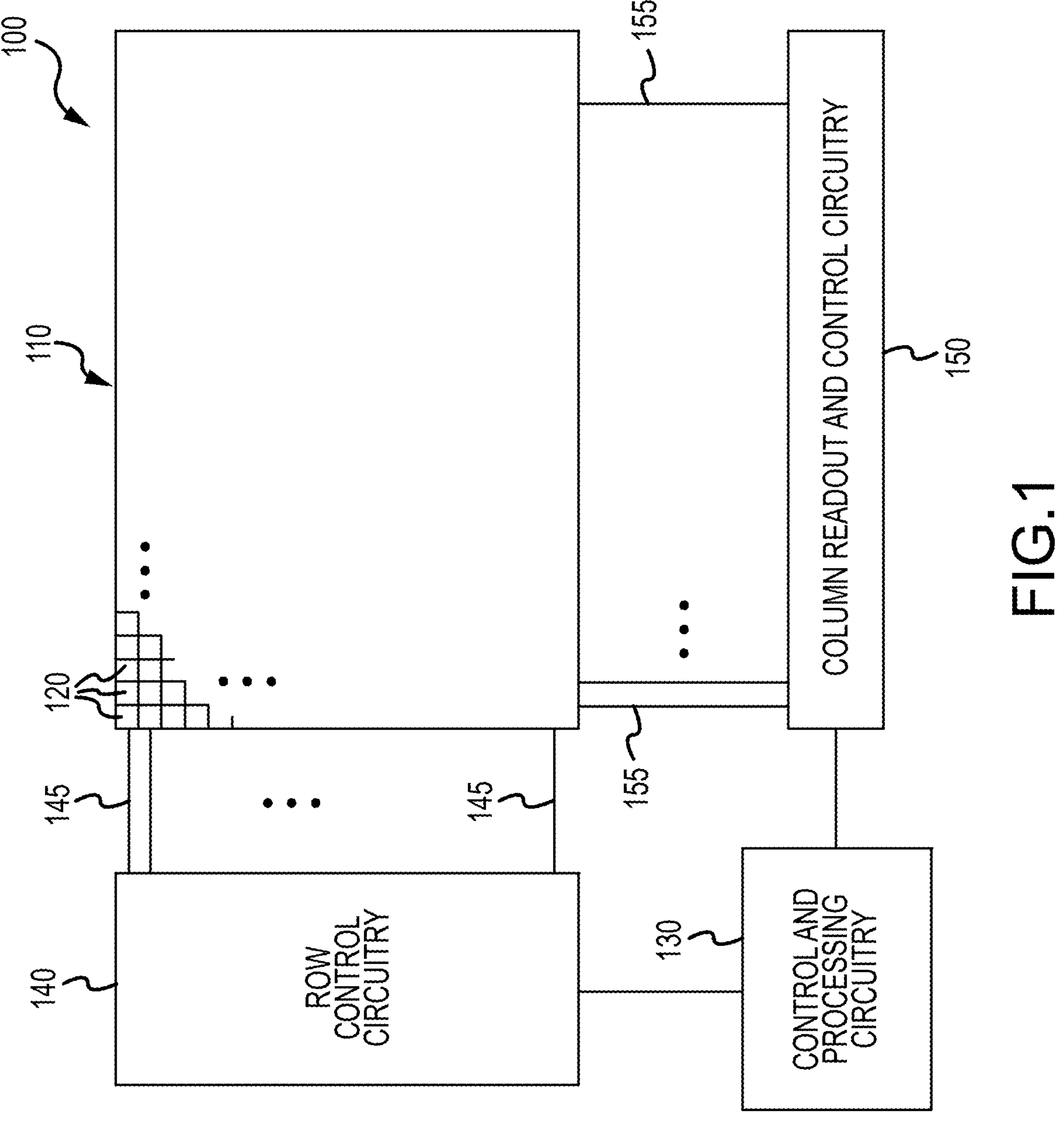
FIG. 1 is a block diagram of an exemplary image sensor, according to various embodiments.

Various embodiments relate to systems, devices, and methods for performing pixel readout in low-noise and high-speed image sensors.

In various embodiments, an image sensor may include: a pixel comprising an output; and a readout circuitry coupled to the pixel output, wherein the readout circuitry comprises: an amplifier having an input and an output, wherein the input is coupled with the pixel output; and an analog-to-digital converter (ADC) comprising: a sample and hold (SH) circuitry comprising an input, an output, a first SH branch coupled between the SH circuitry input and the SH circuitry output, and a second SH branch coupled in parallel with the first SH branch between the SH circuitry input and the SH circuitry output, wherein: the SH circuitry input is coupled with the amplifier output; and the SH circuitry output is configured to determine a combined value based on the first SH branch and second SH branch. The ADC may further include a first digital-to-analog converter (DAC) coupled with the first SH branch; and a second DAC coupled with the second SH branch.

In various embodiments, a method for performing a readout of an image sensor pixel using an analog-to-digital converter (ADC) may include: storing, at a first time and using a first sample and hold (SH) branch of an SH circuitry, a first reset value based on a first output of the pixel; storing, at a second time and using a second SH branch of the SH circuitry, a second reset value based on the first output, wherein: the first SH branch is coupled in parallel with the second SH branch between an input of the SH circuitry and an output of the SH circuitry; and the SH circuitry output provides a combined value based on the first SH branch and the second SH branch; performing, using the ADC, a first analog-to-digital (AD) conversion of a first combined value from the SH circuitry output to generate a digital reset value; storing, at a third time and using the first SH branch, a first image value based on a second output of the pixel; storing, at a fourth time and using the second SH branch, a second image value based on the second output; performing, using the ADC, a second AD conversion of a second combined value from the SH circuitry output to generate a digital image value; and determining a final pixel value based on the digital reset value and the digital image value.

In various embodiments, an analog-to-digital converter (ADC) may include a sample and hold (SH) circuitry comprising an input, an output, a first SH branch coupled between the SH circuitry input and the SH circuitry output, and a second SH branch coupled in parallel with the first SH branch between the SH circuitry input and the SH circuitry output, wherein the SH circuitry input is coupled with an input of the ADC and the SH circuitry output is configured to determine a combined value based on the first SH branch and second SH branch. The ADC may include a first digital-to-analog converter (DAC) coupled with a sample hold node of the first SH branch and a second DAC coupled with the sample hold node of the second SH branch.

These and other examples are described in increasing detail below.

DETAILED DESCRIPTION

The following detailed description is intended to provide several examples that will illustrate the broader concepts that are set forth herein, but it is not intended to limit the invention or the application and uses of the invention. Furthermore, there is no intention to be bound by any theory presented in the preceding background or the following detailed description.

According to various embodiments, analog-to-digital conversion (ADC) systems and methods are used to provide improved analog correlated multi-sampling (CMS) readouts for an image sensor. Various embodiments may include ADC circuitry having a split digital-to-analog converter (DAC), using several smaller DACs in place of a single larger DAC. Various embodiments of the ADC may include multiple parallel sample and hold paths, each coupled with one of the smaller DACs. Various embodiments may provide for multi-sampling of a pixel output using the multiple parallel sample and hold paths, leading to a reduction in readout time, flexibility in number of CMS reads performed, and selectable gain options for the ADC.

According to various embodiments, CMS techniques are described for performing averaging and reduction of noise from various pixel and column readout sources without use of additional capacitor area for sample and hold and DAC circuitry. Further, the disclosed systems and methods require no additional conversions, and require lesser CMS sampling time, saving power and row readout time compared to other digital and analog CMS techniques. The disclosed techniques reduce can reduce noise using CMS without a notable increase in row time compared to a single read of other digital and analog CMS techniques. These and other benefits enable improved low noise and high-speed image sensors. In addition, the disclosed ADC systems and methods may be used in any suitable application, and are not limited to use with image sensors.

CMS readout may include sampling and converting at least one pixel reset signal and one pixel image signal, so that the reset signal may be subtracted from the image signal to generate a final pixel value. CMS may remove, for example, fixed pattern noise to allow for obtained a more accurate measurement of the final pixel value. Analog CMS techniques may include capturing multiple samples of the pixel reset signal and a corresponding number of samples of the pixel image signal. For example, CMS2 may include capturing two reset samples and two image samples, CMS4 may include capturing four reset samples and four image samples, and so on. The plurality of reset samples may be averaged, the plurality of image samples may be averaged, and the averaged reset signal may be subtracted from the averaged image signal to provide a final pixel value having improved signal to noise ratio (SNR). Various embodiments described herein may include separating sample capture events by at least a time period required for uncorrelation of noise.

FIG. 1 illustrates a block diagram of an exemplary image sensor 100. In some embodiments, the configuration of the image sensor, the arrangement of various components therein, and the operation of the various components may be similar, in some aspects, to that which is described with respected to U.S. Pat. No. 11,722,794, which is incorporated herein by reference. The embodiments described herein, however, may be applied to other configurations of image sensors, pixel arrays, pixels, and the like. Some embodiments may be applied to systems other than image sensors. In some embodiments, the image sensor 100 may be implemented as a semiconductor device on a single substrate, stacked substrates, system-on-chip, or the like.

In some embodiments, the image sensor 100 may include a pixel array 110 having multiple image sensor pixels 120. A pixel may include any suitable structures configured to convert incident photons into an electrical signal. For example, the pixel may include a photodiode, transfer gate, reset transistor, floating diffusion (FD) region, source follower transistor configured to output a pixel signal based on the charge present at the floating diffusion region, anti-blooming gate, gain configuration structures such as gain selection transistors and/or capacitors, and/or the like. The pixels 120 may be arranged in any suitable manner. For example, the pixels 120 may be arranged in groups, for example in a stacked sensor arrangement. In some embodiments, the pixels 120 may be arranged in rows and columns.

The image sensor 100 may further include control and processing circuitry 130, which may be referred to herein as control circuitry 130. The control circuitry 130 may be coupled with row control circuitry 140 and column readout and control circuitry 150, which may be referred to herein as readout circuitry 150. The control circuitry 130 may provide timing controls for the row control circuitry 140. Based on the timing controls, the row control circuitry 140 may provide, over one or more conductive row control paths 145, corresponding row control signals such as reset, row select, charge transfer, dual conversion gain, readout, and/or any other suitable pixel control signals to each row of pixels 120.

In some embodiments, the image sensor 100 may include conductive column lines 155 coupled to each column of pixels 120 in the pixel array 110. The column lines 155 may be used for reading out signals from the pixels 120 and for supplying bias currents and/or bias voltages to the pixels 120. In some embodiments, a pixel readout operation may include selecting and controlling a pixel row in the pixel array 120 using the row control circuitry 140 and reading out, using the column lines 155, the pixel values generated by the pixels 120 in the selected row. The pixel values may be analog values, for example an analog voltage or current.

The readout circuitry 150 may control the operation, including readout, of the pixels 120 and may receive the pixel values from the column lines 155. The readout circuitry 150 may include memory circuitry for storing, whether permanently or impermanently, calibration signals such as reset level signals and reference level signals, and/or pixel signals read from the pixel array 120. The readout circuitry 150 may include amplifier circuitry, analog-to-digital conversion (ADC) circuitry, bias circuitry, control circuitry, and/or other circuitry coupled to the pixel columns of the pixel array 110.

The amplifier circuitry may amplify the pixel values readout from the pixel 120, for example reset values and image values, and the ADC circuitry may convert the analog pixel values to digital pixel values. The readout circuitry 150 may provide the digital pixel values to the control circuitry 130 and/or other storage and processing circuitry of the image sensor 100 for further processing. The additional processing may include converting the digital pixel values to image data, performing HDR processing by appropriate combining multiple exposures and/or differently-gained pixel readouts, and the like.

In some embodiments, one or more of the control circuitry 130, row control circuitry 140, and/or readout circuitry 150 may include associated storage circuitry configured to store instructions, such as firmware, software, or the like, executable by the a processing component of the respective control circuitry 130, 140, 150. The associated storage circuitry may include, for example, non-transitory computer-readable media. The stored instructions may, when executed by the respective processing component, implement one or more processes described herein, for example one or more timing diagrams for controlling one or more pixels 120 and/or readout circuitry 150, one or more process flow diagrams for performing pixel readout and conversion, and/or the like.

Figure 2:
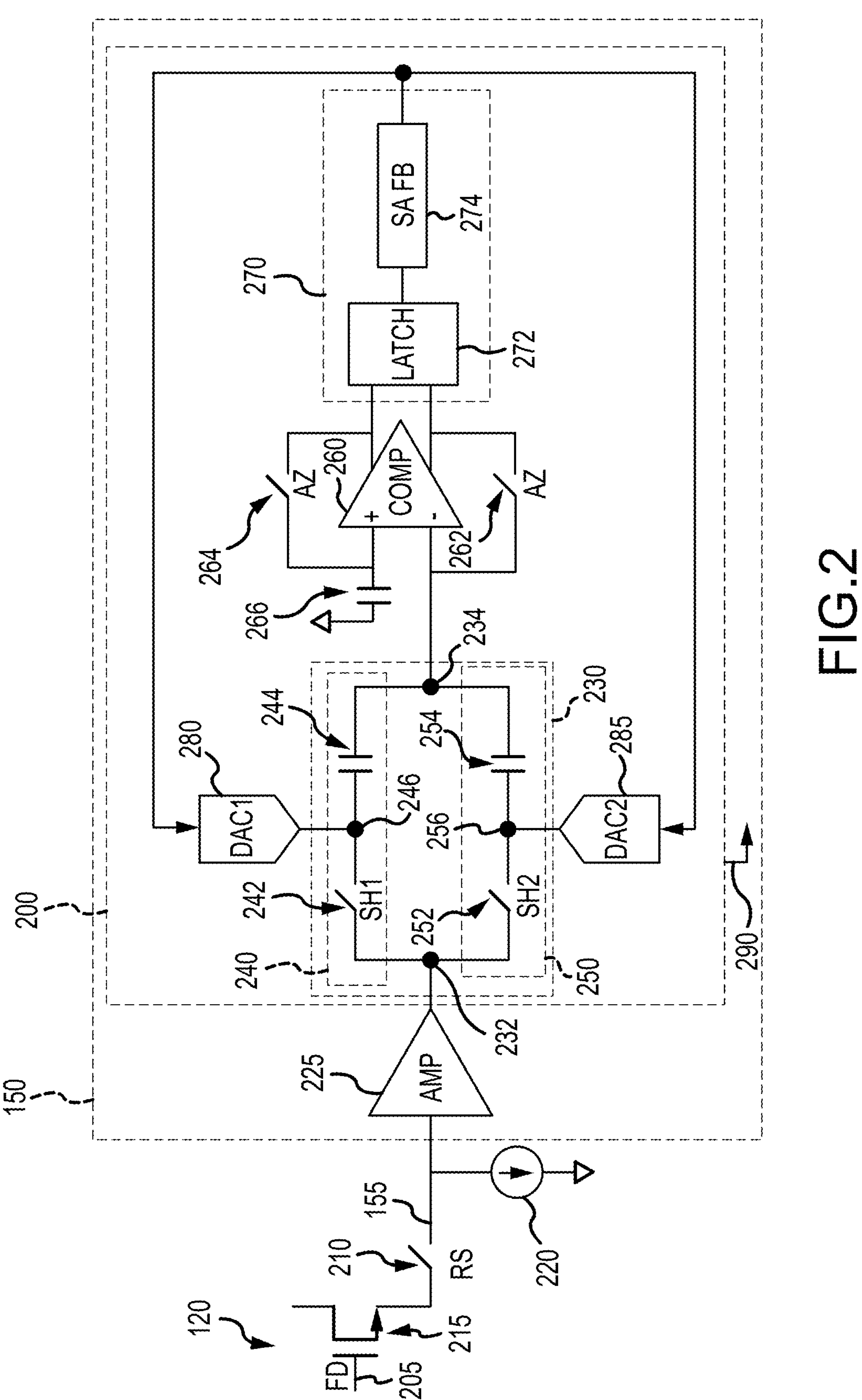
FIG. 2 is a schematic diagram showing an exemplary readout circuitry coupled with the output of a pixel, according to various embodiments.

FIG. 2 is a schematic diagram showing exemplary readout circuitry 150 coupled with the output of the pixel 120, for example configured to read a pixel value based on the charge at a floating diffusion region 205 via a row select switch 210 and source follower transistor 215. For the sake of clarity, the remainder of the pixel 120 is not reproduced in FIG. 2.

In some embodiments, the pixel 120 may include a source follower transistor 215 and a pixel or row select switch 210 that form an output circuitry portion of the pixel 120. The select switch 210 may be configured to receive a control signal ‘RS’ for control of the select switch 210. In some embodiments, the select switch 210 may comprise a transistor having a control input, such as a gate, configured to receive the ‘RS’ control signal. The source follower transistor 215 may couple a voltage terminal (not shown) to the select switch 210, and the control terminal of the source follower transistor 215 may be coupled with the floating diffusion region 205. The voltage terminal may provide a voltage reference signal, such as an analog-level supply voltage.

The select switch 210 may couple the source follower transistor 215 to a column line 155 of the pixel array 110. In some embodiments, a column line 155 may be associated with one or more columns of pixels, and the ‘RS’ signal may be asserted to read a pixel signal from a particular row of pixels. In some embodiments, the column line 155 may be coupled to a current source 220, which may be referred to herein as VLN circuitry 220. The current source 220 may be further coupled with a common voltage, such as a ground. The current source 220 may provide a reference current for the column line 155 and may facilitate accurate measurement of a voltage or a voltage change on the column line 155 due to readout of a pixel value. In some embodiments, the readout circuitry 150 may include the current source 220.

When the control signal ‘RS’ is asserted, a corresponding pixel output signal having a magnitude proportional to the amount of charge at the floating diffusion region 205 is passed to the column line 155 via the source follower transistor 215 and the select switch 210. When the floating diffusion region 205 stores charge generated by a photodiode (not shown) of the pixel 120 in response to receiving incident light, the corresponding pixel output signal may be referred to as an image signal or image level signal. When the floating diffusion region 205 stores a reset voltage level charge, for example after a reset operation, the corresponding pixel output signal may be referred to as a reset signal or reset level signal. The pixel output signal may be provided to the readout circuitry 150, and to the control circuitry 130 and/or other processing circuitry as desired.

In some embodiments, for example for HDR applications, the pixel 120 may be adapted and controlled to generate more than one set of image and reset signals for each integration time period. The multiple image and reset signals may be read out in two or more operations using varying gains. For example, the pixel 120 may be adapted and controlled to perform a low conversion gain (LCG) readout, a medium conversion gain (MCG) readout, and/or a high conversion gain (HCG) readout. In some embodiments, the pixel 120 may include one or more conversion gain devices configured to facilitate the LCG, MCG, and/or HCG readouts.

In some embodiments, the readout circuitry 150 may include an amplifier 225. The amplifier 225 may comprise any suitable circuitry configured to provide, on its output, a gained version of a voltage level received at its input. For example, an input of the amplifier 225 may be coupled with the column line 155, and the amplifier 225 may be configured to amplify a voltage level or voltage swing on the column line 155 caused by a readout of a pixel value from the pixel 120, and to provide the amplified voltage at its output.

In some embodiments, the amplifier 225 may include a positive and a negative input (not shown). For example, the column line 155 may be coupled with the negative input of the amplifier 225, and the positive input of the amplifier 225 may be coupled with a voltage reference, such as a common mode voltage reference. The common mode voltage reference may be any suitable voltage, for example around 1 Volt (V). Other examples may include the column line 155 coupled with the positive input of the amplifier 225 and a voltage reference coupled with the negative input. It will be recognized that the output of the amplifier 225 may be configured to be positive or negative depending on design of the readout circuitry 150, voltage levels at which the image sensor 100 operates, and/or the like.

The output of the amplifier 225 may be coupled with an input of an analog-to-digital converter (ADC) 200. The ADC 200 may comprise circuitry and/or methods configured to convert an analog voltage level at input of the ADC 200 to a digital representation of the analog voltage level, and to provide the digital representation on an output of the ADC 200. In some embodiments, the ADC 200 may be configured or otherwise controllable to provide one or more digital representations having a gain compared to the analog input, for example having a gain of 1, 2, 4, 8, 16, and/or the like.

In some embodiments, the ADC 200 may comprise a successive-approximation (SA) ADC. The ADC 200 may include suitable circuitry and/or methods configured to convert the analog level to the digital representation using an SA algorithm. A suitable SA algorithm may include performing a binary search through a series of quantization levels to converge on the digital representation. In some embodiments, the SA algorithm may include using one or more charge-scaling DACs, each of which may include an array of individually switched binary-weighted capacitors providing the quantization levels. The amount of charge on each capacitor in the array can be used to perform a binary search in combination with the SH circuitry 230, comparator 260, and ADC control circuitry 270.

In some embodiments, the ADC 200 may include a sample and hold (SH) circuitry 230 having an input 232 coupled with the output of the amplifier 225. The input 232 of the SH circuitry 230 may form the input of the ADC 200. The SH circuitry 230 may include circuitry configured to capture (sample) and maintain (hold) a voltage level from the input of the SH circuitry 230, providing for stable measurements and/or processing of the captured voltage level. In various embodiments, control circuitry 130 and/or readout circuitry 150 may control the SH circuitry 230 to capture voltage levels corresponding to a reset signal and/or image signal from various pixel 120 readout operations.

In some embodiments, the SH circuitry 230 may include multiple parallel sample and hold branches. For example, the SH circuitry 230 may include a first SH branch 240 and a second SH branch 250. Each SH branch 240, 250 may include suitable circuitry for performing sample and hold operations. In some embodiments, each SH branch 240, 250 may include identical circuitry. For example, the first SH branch 240 may include a switch 242 coupled in series between the SH circuitry 230 input and an SH capacitor 244, with the SH capacitor 244 coupled in series between the switch 242 and an output 234 of the SH circuitry 230. The second SH branch 250 may also include a switch 252 coupled in series between the SH circuitry 230 input and an SH capacitor 254, with the SH capacitor 254 coupled in series between the switch 252 and the SH circuitry output 234. The SH capacitors 244, 254 may also be referred to as coupling capacitors.

The switch 242 and SH capacitor 244 of the first SH branch 240 may be coupled at a first sample hold node 246 configured to couple with a digital-to-analog converter (DAC). The switch 252 and SH capacitor 254 of the second SH branch 250 may be coupled at a second sample hold node 256 configured to couple with a digital-to-analog converter (DAC). The sample hold node of each SH branch may include the electrical node at which the value sampled at the SH circuitry input 232 is stored, for example the node between the switch and capacitor of the respective SH branch. The first sample hold node 246 may be referred to herein as the Vdac1 node 246, and the second sample hold node 256 may be referred to herein as the Vdac2 node 256.

The switches 242, 252 may comprise any suitable electrical switch, for example a transistor having a control terminal such as a gate contact. In some embodiments, the switches 242, 252 may include a complementary metal oxide semiconductor (CMOS) transistor. The switch 242 of the first SH branch 240 may be controlled by a signal 'SH1,' and the switch 252 of the second SH branch 250 may be controlled by a signal 'SH2.' Each switch 242, 252 may be closed, according to the respective control signals, to acquire a voltage level from the SH circuitry input 232 for storage by the respective SH capacitors 244, 254. Each switch 242, 252 may be opened, according to the respective control signals, to maintain the voltage level from the SH circuitry input 232 according to the value stored by the respective SH capacitors 244, 254.

In some embodiments, the SH capacitors 244, 254 may be configured to have the same size, for example having the same capacitance, area, and the like. Further, according to various embodiments, increasing the number of SH branches in the SH circuitry 230 does not require an increase in the total area required for SH capacitors. For example, the total area required for all SH capacitors of the SH circuitry 230, regardless of the number of SH branches, may be the same or approximately the same as the area required for a capacitor used for storing the amplified pixel signal value in a non-branched sample and hold circuitry (or the single SH capacitor in an SH circuitry 230 having only a single SH branch).

Accordingly, in a configuration of the SH circuitry 230 having two SH branches such as illustrated in FIG. 2, the capacitance and area of each SH capacitor 244, 254 may be half that of the SH capacitor in a single-branch (or non-branched) configuration. For example, if the capacitor in a non-branched configuration is designed with a capacitance of 200 femtofarads (fF), then each SH capacitor 244, 254 of the two-branch configuration may be designed with a capacitance of 100 fF. For further example, in a configuration of the SH circuitry 230 having four SH branches, the capacitance and area of each SH capacitor may be a quarter that of an SH capacitor in a single-branch configuration, for example four capacitors each having a capacitance of 50 fF compared to a single capacitor having a capacitance of 200 fF. It will be recognized that the exemplary capacitance values discussed above may be suitably selected or changed based on design requirements, performance goals, and/or the like.

The SH circuitry output 234 may determine and provide a combined value based on each of the SH branches of the SH circuitry 230. In some embodiments, the combined value may be based on the capacitive divider principle, where the node voltage at the SH circuitry output 234 is equal to the average of the voltage or voltage change occurring at the input of each SH capacitor in each SH branch of the SH circuitry 230. For example, the illustrated SH circuitry 230 of FIG. 2 may provide a combined value based on the average of the voltage at the Vdac1 node 246 and the Vdac2 node 256. Advantageously, when sampling a signal having noise, the signal sampled in each SH branch 240, 250 will average to the same signal at the SH circuitry output 234, whereas the noise, for example uncorrelated noise which is random, will be reduced by a factor of $\sqrt{2}$ for an SH circuitry 230 configuration having two SH branches. The signal-to-noise ratio (SNR) accordingly increases by a factor of approximately 1.4 for SH circuitry 230 having two SH branches 240, 250.

Figure 3:
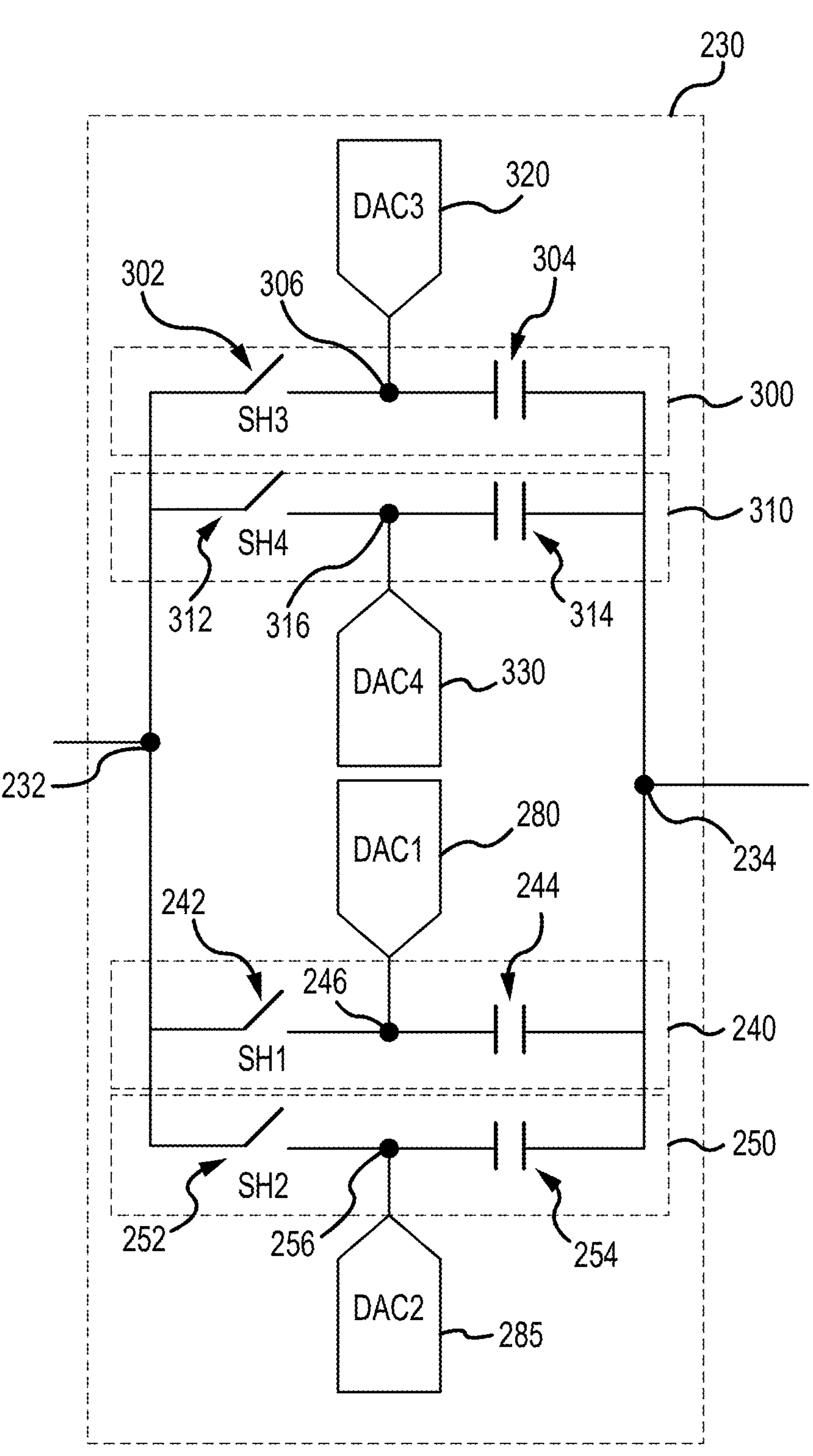
FIG. 3 is a schematic diagram showing an exemplary sample and hold circuitry, according to various embodiments.

The systems and methods described herein are advantageously scalable for a higher number of CMS samples. Referring briefly to FIG. 3, in some embodiments the SH circuitry 230 may include four SH branches, including the first SH branch 240, second SH branch 250, a third SH branch 300, and a fourth SH branch 310, enabling up to CMS4. As described above, in some embodiments, each SH branch 240, 250, 300, 310 may include identical circuitry. For example, the third SH branch 300 may include a switch 302 coupled in series between the SH circuitry 230 input and an SH capacitor 304, with the SH capacitor 304 coupled in series between the switch 302 and an output 234 of the SH circuitry 230. The fourth SH branch 310 may include a switch 312 coupled in series between the SH circuitry 230 input and an SH capacitor 314, with the SH capacitor 314 coupled in series between the switch 312 and an output 234 of the SH circuitry 230. The first SH branch 240, second SH branch 250, third SH branch 300, and fourth SH branch 310 may be electrically coupled in parallel with each other.

The switch 302 and SH capacitor 304 of the third SH branch 300 may be coupled at a third node 306 configured to couple with a digital-to-analog converter (DAC). The switch 312 and SH capacitor 314 of the fourth SH branch 310 may be coupled at a fourth node 316 configured to couple with a digital-to-analog converter (DAC). The third node 306 may be referred to herein as the Vdac3 node 306, and the fourth node 316 may be referred to herein as the Vdac4 node 316. The switches 302, 312 for the third 300 and fourth 310 SH branches may perform the same function, be similarly controlled, and may comprise the same type of switch as the switches 242, 252 used in the first 240 and second 250 SH branches. The switch 302 may be controlled by a signal 'SH3' and the switch 312 may be controlled by a signal 'SH4.'

In some embodiments, the SH capacitors 244, 254, 304, 314 may be configured to have the same size, for example having the same capacitance, surface area, and the like. As described above, in some embodiments, the total area required for all SH capacitors 244, 254, 304, 314 of the SH circuitry 230, may be the same or approximately the same as the area required for a capacitor used for storing the amplified pixel signal value in a non-branched sample and hold circuitry. Accordingly, in a configuration of the SH circuitry 230 having four SH branches 240, 250, 300, 310 such as illustrated in FIG. 3, the capacitance, surface area, and/or the like of each SH capacitor 244, 254, 304, 314 may be approximately half that of the SH capacitors 244, 254 in a two branch configuration, and may be approximately a quarter that of the storage capacitor in an non-branched sample and hold circuit.

In some embodiments, the total area required for all SH capacitors 244, 254, 304, 314 may only be approximately the same as that required in a non-branched sample and hold circuitry, with a difference in size, capacitance, and/or the like due to error, tolerances, design choice, and/or the like. For example, differential nonlinearity constraints, integral nonlinearity constraints, and/or the like may affect the designed size of the respective capacitors and/or the manufactured size of the respective capacitors. For further example, manufacturing limitations may not allow for exact duplication or reduction in size of capacitor features such as the electrode plates, dielectric thickness, and/or the like, for example due to nonlinear scaling of capacitors, and the design may be adapted to accommodate such limitations without deviating from the embodiments described herein.

Still referring to FIG. 3, The SH circuitry output 234 may provide a combined value based on each of the four SH branches 240, 250, 300, 310 of the SH circuitry 230. As described above, the combined value may be based on the average of the voltage or voltage change occurring at the input of each SH capacitor in each SH branch of the SH circuitry 230. For example, the illustrated SH circuitry 230 of FIG. 3 may provide a combined value based on the average of the voltage at the Vdac1 node 246, Vdac2 node 256, Vdac3 node 306, and Vdac4 node 316. Advantageously, when sampling a signal having noise, the signal sampled in each SH branch 240, 250, 300, 310 will average to the same signal at the SH circuitry output 234, whereas the noise, for example uncorrelated noise, will be reduced by a factor of $\sqrt{4}$ for an SH circuitry 230 configuration having four SH branches. The signal-to-noise ratio (SNR) accordingly may increase by a factor of approximately 2 for SH circuitry 230 having four SH branches 240, 250, 300, 310.

More generally, the SH circuitry 230 may include any suitable number of SH branches. The principles described above with respect to FIGS. 2 and 3 for the multi-branched SH circuitry 230 can be used to extend the SH circuitry 230 to include a greater or lesser number of SH branches as desired. In each case, the signal will average to the signal, the noise will be reduced by the square root of the number of SH branches if the samples are uncorrelated, and the total capacitor sizing and/or capacitance will sum up to be equivalent or approximately equivalent to that of the storage capacitor for an unbranched sample and hold circuit.

Referring to FIGS. 2 and 3, in some embodiments, the ADC 200 may include a DAC for each SH branch of the SH circuitry 230. Each DAC may be coupled with the sample hold node of a corresponding SH branch. For example, embodiments according to the SH circuitry 230 illustrated in FIG. 2 may include a first DAC 280 coupled to the Vdac1 node 246 and a second DAC 285 coupled to the Vdac2 node 256. For further example, embodiments according to the SH circuitry 230 illustrated in FIG. 3 may include a first DAC 280 coupled to the Vdac1 node 246, a second DAC 285 coupled to the Vdac2 node 256, a third DAC 320 coupled to the Vdac3 node 306, and a fourth DAC 330 coupled to the Vdac4 node 316.

In some embodiments, each DAC 280, 285, 320, 330 may comprise an array of individually switched capacitors, where each capacitor in an array of capacitors has a different capacitance value. The array of switched capacitors may include an array of binary-weighted capacitors such that the capacitance of each capacitor in the array is related by powers of two. For example, each DAC 280, 285, 320, 330 may include a 12-bit DAC having 12 capacitors, wherein a capacitor representing the least significant bit (LSB) has a relative capacitance of 1, the second least significant bit has a relative capacitance that is twice that of the capacitor representing the LSB, and so on, where the capacitor representing the most significant bit (MSB) has a relative capacitance of $2^{11}$. In some such embodiments, each successive capacitor, from the LSB to the MSB, may be double the size of the prior capacitor. As discussed above, nonlinearity and/or other consideration may cause capacitor sizing to be approximate.

The arrays of binary-weighted switched capacitors may be configured to facilitate performance of the SA algorithm by the ADC 200. In some embodiments, a first terminal of each capacitor in the arrays of switched capacitors for a DAC 280, 285, 320, 330 may be coupled with the respective sample hold nodes, for example Vdac1 node 246, Vdac2 node 256, Vdac3 node 306, and Vdac4 node 316. The first terminal of a capacitor may be referred to herein as the top plate or first plate of the capacitor. A second terminal of each capacitor in the arrays of switched capacitors may be configured to be controllably switched to a 'high' and 'low' signal, for example to a reference voltage (e.g., 'high') and a common voltage such as ground (e.g., 'low'). The reference voltage may correspond to the full-scale range of the ADC 200. The reference voltage may be selectable, for example if selecting a different gain multiple for the ADC 200 as described in more detail below. The second terminal of a capacitor may be referred to herein as the bottom plate or second plate of the capacitor.

During operation of a DAC, after a voltage value has been sampled and held at the sample hold node, switching the bottom plate of a capacitor of the array of capacitors to 'high' or 'low' will cause a change in the voltage at the respective sample hold node. The change in voltage will be proportional to the weight of the binary-weighted capacitor that was switched. For example, switching the bottom plate of the capacitor for the second least significant bit will cause double the change at the sample hold node compared to switching the bottom plate of the capacitor for the LSB, switching the third least significant bit will cause double the change compared to switching the second least significant bit, and so on.

Successively switching each capacitor of the array of capacitors of the DAC, for example from the MSB to the LSB, will lead to a series of analog voltage steps at the respective sample hold node. For example, successively switching each capacitor of the array of binary weighted capacitors of the first DAC 280, after sampling and holding a voltage value at the Vdac1 node 246, will lead to a series of analog voltage steps at the Vdac1 node 246. The voltage changes at the sample hold node are transferred through the respective coupling capacitor, for example voltage changes at the Vdac1 node 246 are transferred through the SH capacitor 244 to the SH circuitry output 234.

Each DAC 280, 285, 320, 330 may be controlled to simultaneously switch its array of capacitors to perform the SA algorithm simultaneously for each respective SH branch 240, 250, 300, 310. Each stepped voltage value transferred through the respective coupling capacitors may then be averaged at the SH circuitry output 234 as described above.

In some embodiments, each array of switched capacitors of each DAC 280, 285, 320, 330 may be configured to have the same set of capacitor sizes. For example, each DAC 280, 285, 320, 330 may have the same number of capacitors in the array of capacitors, each array with the same set of capacitor sizes (such as capacitance, area, or the like). Further, according to various embodiments, increasing the number of SH branches in the SH circuitry 230 and therefore the number of DACs does not require an increase in the total area required for the DAC switched capacitors. For example, the total area required for all DAC switched capacitors of the ADC 200, regardless of the number of SH branches, may be the same or approximately the same as the total area required for an array of switched capacitors used for the single DAC in a non-branched sample and hold circuitry. Each DAC in a multi-branch configuration of the SH circuitry 230 may have the same number of switched capacitors, for example 12 capacitors for a 12-bit DAC, regardless of the number of SH branches used by the SH circuitry 230.

Accordingly, in a configuration of the SH circuitry 230 having two SH branches such as illustrated in FIG. 2, the total capacitance and area of the array of switched capacitors in each DAC 280, 285 may be half that of the array of switched capacitors in a DAC in a single-branch (or non-branched) configuration. For example, if the array of switched capacitors in a DAC for a non-branched configuration is designed with a combined capacitance of 1 picofarad (pF), then each array of capacitors for each DAC 280, 285 of the two-branch configuration may be designed with a capacitance of 500 fF. For further example, referring to FIG. 3, in a configuration of the SH circuitry 230 having four SH branches, the capacitance and area of each array of capacitors for each DAC 280, 285, 320, 330 may be a quarter that of a DAC in a single-branch configuration, for example with each array of capacitors having a combined capacitance of 250 fF.

Referring again to FIG. 2, in some embodiments, the ADC 200 may include a comparator 260 having a first and second input. The comparator 260 may include any suitable circuitry configured to compare the values at its inputs, for example analog voltage levels, and to provide an output based on the comparison result. The output may include a differential output, single-ended output, binary output, and/or the like. In some embodiments, the comparator 260 output may include a differential output having a first and second output signals that swing in opposite voltage directions based on whether a first comparator 260 input is greater or lesser than a second comparator 260 input and/or based on the magnitude of the difference between the first and second inputs.

In some embodiments, the comparator 260 may have a first input coupled with the SH circuitry output 234 and a second input coupled with a reference voltage, for example a common voltage such as ground. The comparator 260 may compare the averaged stepped voltage value from the SH circuitry output 234 with the reference voltage, for each stepped voltage value caused by the successively switched capacitors of the DACs 280, 285, 320, 330. In some embodiments, the first input may be a negative input to the comparator 260 and the second input may be a positive input to the comparator 260. Alternate embodiments may have the positive input coupled with the SH circuitry output 234 and the negative input coupled with a reference voltage, as desired. The comparator 260 may be coupled with the reference voltage through a capacitor 266 as desired.

The comparator 260 may have its output(s) coupled with one or more of its respective inputs through one or more switches 262, 264. The switches may be controlled to perform auto-zeroing of the comparator 260 prior to performing a comparison. In some embodiments, a first output signal of the differential output may be coupled with the first input of the comparator 260 through a switch 262 and a second output signal of the differential output may be coupled with the second input of the comparator 260 through a switch 264. The switches 262, 264 may be controlled through a control signal 'AZ.'

In some embodiments, the ADC 200 may include an ADC control circuitry 270. The ADC control circuitry 270 may include any suitable circuitry and/or method configured to control each DAC 280, 285 coupled with the SH circuitry 230 based on the comparison result received from the comparator 260. The ADC control circuitry 270 may be configured to control each DAC 280, 285 according to the SA algorithm. For example, the ADC control circuitry 270 may include suitable circuitry operable to control the switched capacitors of the DACs 280, 285 to perform the binary search of the SA algorithm, successively switching each capacitor in the array of capacitors of each DAC 280, 285 to test and determine a digital representation (e.g., binary value) for the respective bit position (e.g., MSB, LSB, etc.) corresponding to the tested capacitor. In some embodiments, the ADC control circuitry 270 may include the comparator 260.

The ADC control circuitry 270 may have one or more inputs coupled with the one or more outputs of the comparator 260. The ADC control circuitry 270 may have an output, for example providing control signal(s), coupled with and configured to control each DAC coupled with each SH branch. For example, in embodiments as illustrated in FIG. 2, the ADC control circuitry 270 may have an output coupled with each of the two DACs 280, 285, and in embodiments as illustrated in FIG. 3, the ADC control circuitry 270 may have an output coupled with each of the four DACs 280, 285, 320, 330. The ADC control circuitry 270 may provide identical control of each DAC coupled with the SH circuitry 230.

In some embodiments, referring again to FIG. 2, each DAC 280, 285 coupled with each SH branch 240, 250 of the SH circuitry 230 may receive the same control signals from the ADC control circuitry 270. The control signals output by the ADC control circuitry 270 may be configured to control switching of the arrays of switched capacitors of the DACs 280, 285, and may provide an indication of a determined value, for example a logic '1' or '0,' for the currently tested capacitor (e.g., corresponding to MSB, LSB, etc.). The determined value may represent the determined digital representation, for the tested bit, of the analog voltage value sampled from the SH circuitry input 232.

In some embodiments, the ADC control circuitry 270 may include a latch 272 and a SA feedback circuitry 274. The latch 272 may include any suitable device for converting the output of the comparator 260 to a binary value. For example, the latch 272 may include a set reset (SR) latch receiving a differential output from the comparator 260, and the latch 272 may set (binary '1') or reset (binary '0') its output based on the received differential output signals.

In some embodiments, the SA feedback circuitry 274 may be coupled to receive the output of the latch 272. The SA feedback circuitry 274 may include any suitable circuitry configured to determine a binary value for the tested bit position, based on the comparison result from the comparator 260 and latch 272. The SA feedback circuitry 274 may include any suitable circuitry configured to control switching of the arrays of capacitors of the DACs 280, 285 according to the SA algorithm, for example configured to provide the control signals to the DACs 280, 285.

The SA feedback circuitry 274 may be configured to determine, based on the comparison result, whether the currently-tested bit should be reset in the DACs or should remain set. Resetting the currently-tested bit may include setting the currently-switched capacitor to its untested state. The SA feedback circuitry 274 may be configured to then control (switch, set) the next capacitor to be tested. The SA feedback circuitry 274 may be configured to provide a signal to the DACs 280, 285 and/or other components of the image sensor 100 indicating the determined binary value for the given tested bit position.

The SA feedback circuitry 274 may start with the capacitor corresponding to the MSB which has highest weight, resolve each bit position in order, ending with the LSB which has the lowest weight. For example, with 12-bit DACs, the SA feedback circuitry 274 may set the $12^{th}$ bit, if the comparison result indicates that the value was too high then the SA feedback circuitry 274 may reset the $12^{th}$ bit and then test the $11^{th}$ bit, and so on.

In some embodiments, the ADC control circuitry 270, for example via the SA feedback circuitry 274, may store in a memory, output, or otherwise provide the converged-upon digital representation (a digital value) from performing the SA algorithm for a given analog value sampled at the SH circuitry input 232. In some embodiments, one or more of the DACs 280, 285 may store or otherwise output the determined (converged-upon) digital representation. In some embodiments, one or more DACs 280, 285 may store the determined digital representation in a column memory (not shown). The ADC 200 may include an ADC output 290 configured to provide the determined digital representation of the analog value sampled at the SH circuitry input 232, for example from the one or more DACs 280, 285, from the SA feedback circuitry 274, and/or the like.

Figure 4:
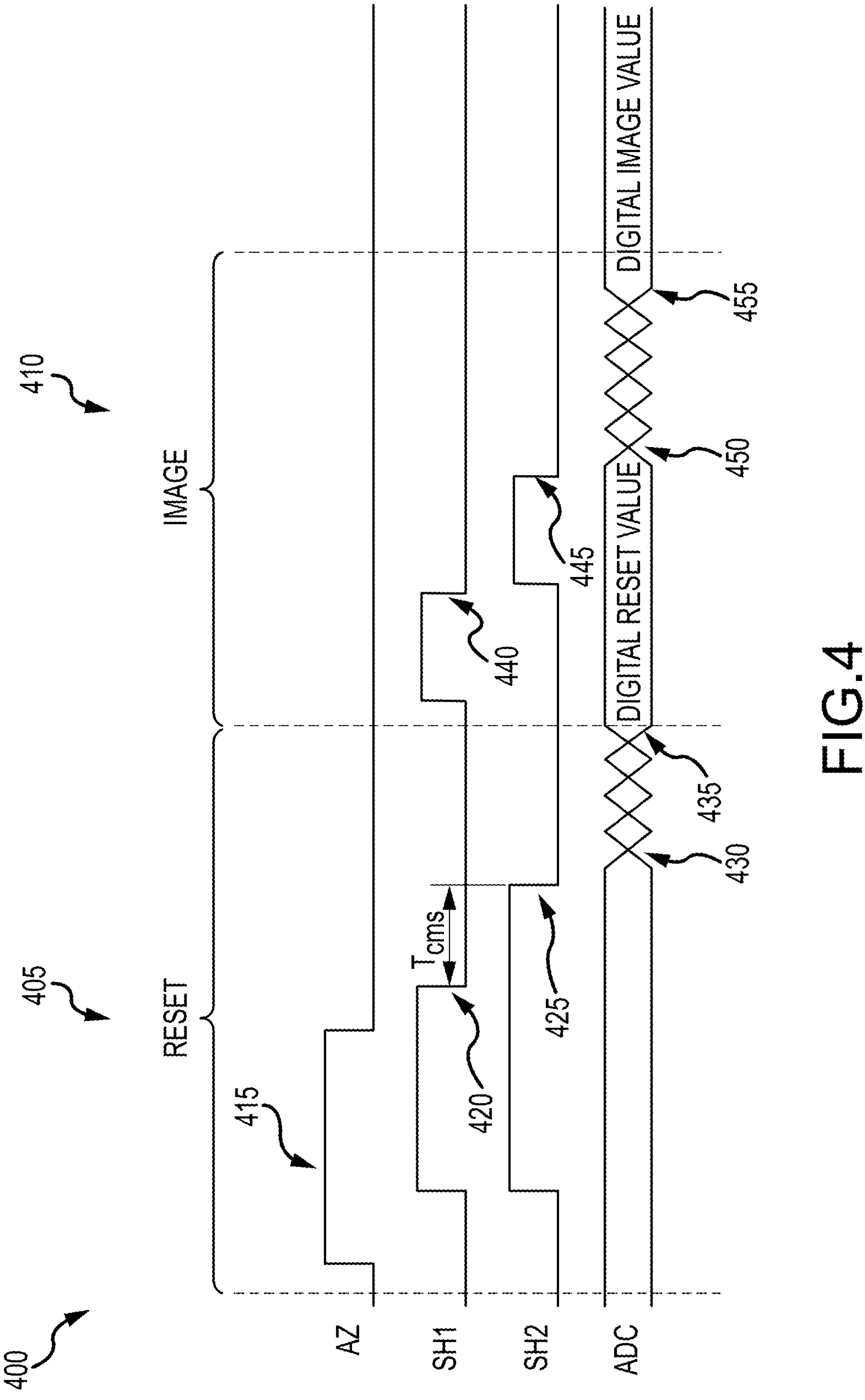
FIG. 4 is an illustrative timing diagram for operating an exemplary analog-to-digital converter (ADC), according to various embodiments.

FIG. 4 is an illustrative timing diagram 400 for operating the ADC 200 to perform AD conversion of multiple reset value and image values from a pixel 120 output, for example during a CMS2 readout. The timing diagram 400 may correspond to a two-branch SH circuitry 230 such as illustrated in FIG. 2. In some embodiments, the control signals described above, such as 'AZ,' 'SH1,' and 'SH2' may be used to control the operation of the ADC 200. For example, control circuitry such as the control circuitry 130 and readout circuitry 150 may be configured to provide one or more of these control signals to the corresponding components of the ADC 200 via respective control paths.

The control circuitry may operate the ADC 200 during a reset signal readout time period 405 and an image signal readout time period 410. During the reset signal time period 405, the control circuitry may control the pixel 120 to output a pixel signal corresponding to a reset level of the pixel 120, for example to be received by the readout circuitry 150. During the image signal time period 410, the control circuitry may control the pixel 120 to output a pixel signal corresponding to an image level of the pixel 120, for example to be received by the readout circuitry 150.

While the pixel 120 is outputting a reset signal during the reset signal time period 405, the ADC 200 may be controlled to autozero the comparator 260. Autozeroing the comparator 260 may include setting the common mode for the comparator 260, for example by setting the inputs and outputs of the comparator 260 to a same or known value prior to sampling. The comparator 260 may be autozeroed by asserting 415 the 'AZ' signal controlling switches 262, 264 of the comparator 260. At the end of the 'AZ' assertion 415, the switches 262, 264 will open allowing the comparator 260 to make comparison decisions based on the input(s) to the comparator 260.

The SH circuitry 230 may acquire two or more samples of the reset signal output by the pixel 120 during the reset signal time period 405. By way of non-limiting example, a sample of the pixel signal value read out of the pixel 120 may be stored by an SH branch of the SH circuitry 230 on the falling edge of the respective 'SH' signal. The number of reset samples, and subsequent image samples, storable by the SH circuitry 230 corresponds to the number of SH branches of the SH circuitry 230. The number of reset and image samples storable therefore corresponds to the number of CMS reads capable of being performed for a reset signal or an image signal from the pixel 120. For example, an SH circuitry 230 having two SH branches 240, 250 may perform a CMS2 readout and conversion, and an SH circuitry 230 having four SH branches may perform a CMS4 readout and conversion.

A multi-branch SH circuitry 230 may also perform a lesser CMS readout than the total number of storable samples available. By way of non-limiting example, in some embodiments, a multi-branch SH circuitry 230 having four branches may perform CMS2 by capturing a same sample on multiple sample hold nodes of the SH circuitry 230. For example, the control signals 'SH1' and 'SH2' may be operated to have their falling edges align to capture a first sample at both the Vdac1 node 246 and Vdac2 node 256, and the control signals 'SH3' and 'SH4' may be operated to have their falling edges align at a time $T_{CMS}$ later to capture a second sample at both the Vdac3 node 306 and Vdac4 node 316. The SH circuitry 230 therefore provides flexibility for improving frame rate or performing a higher CMS read as desired.

One or more SH branches, for example the first SH branch 240 and the second SH branch 250, may each be controlled to sample and hold an analog voltage value based on the reset signal output by the pixel 120. The respective control signals, for example 'SH1' and 'SH2,' may be asserted to cause the switches 242, 252 to close, allowing the analog voltage at the SH circuitry input 232 to charge the respective SH capacitors 244, 254. The control signal 'SH1' may be de-asserted at a first time 420, storing a first sample of the reset signal on the Vdac1 node 246 at the first time 420. The control signal 'SH2' may be de-asserted at a second time 425 later than the first time, storing a second sample of the reset signal on the Vdac2 node 256 at the second time 425.

The first time and the second time may be separated by an uncorrelation time period, $T_{CMS}$, which is a minimum time period required to provide a desired uncorrelation of noise between the first reset sample and the second reset sample. In some embodiments, increasing the time $T_{CMS}$ may increase the uncorrelation of noise. In some embodiments, $T_{CMS}$ may be in the range of nanoseconds (ns), for example hundreds of nanoseconds, for example about 300 ns, 400 ns, 500 ns, and/or the like. Advantageously, acquiring each additional reset sample beyond the first sample in a multi-branch SH circuitry 230 requires only an additional $T_{CMS}$ period for each such additional sample. For example, acquiring two reset samples requires only a single additional $T_{CMS}$ period compared to acquiring a single reset sample in a non-branched SH circuitry, and acquiring four reset samples in a four-branched SH circuitry 230 comparatively requires only three additional $T_{CMS}$ periods.

During the reset signal time period 405 and after storing the reset samples at first and second times 420, 425, the first and second reset samples may be averaged at the SH circuitry output 234 as described above, and the ADC 200 may begin 430 performing the SA algorithm. As described above, the ADC control circuitry 270 or other suitably control circuitry may control the DACs 280, 285 to successively switch the respective arrays of switched capacitors to converge on a digital representation based on the multiple sampled reset values stored at first and second times 420, 425. Upon completion 435 of the SA algorithm, the digital representation of the reset value may be stored or otherwise provided by the ADC 200.

While the pixel 120 is outputting an image signal during the image signal time period 410, the SH circuitry 230 may acquire two or more samples of the image signal output by the pixel 120. Acquisition of multiple image signal samples may be done in a staggered manner. For example, the first SH branch 240 and the second SH branch 250 may each be controlled to sample and hold an analog voltage value based on the image signal output by the pixel 120. The control signal 'SH1' may first be asserted to cause the switch 242 to close, allowing the analog voltage at the SH circuitry input 232 to charge the SH capacitor 244. The control signal 'SH1' may then be de-asserted at a third time 440, storing a first sample of the image signal on the Vdac1 node 246 at the third time 440.

In some embodiments, staggering the reset sampling in an analogous manner may not be possible depending on the KTC noise caused by the reset operation of the pixel 120. Once the KTC reset noise is captured in all reset samples taken by the SH circuitry 230, the image samples taken by the SH circuitry 230 can be staggered.

In some embodiments, after the control signal 'SH1' is de-asserted at the third time 440, the control signal 'SH2' may be asserted to cause the switch 252 to close, allowing the analog voltage at the SH circuitry input 232 to charge the SH capacitor 254. The control signal 'SH2' may then be de-asserted at a fourth time 445, storing a second sample of the image signal on the Vdac2 node 256 at the fourth time 445. In some alternative embodiments, the control signal 'SH2' may be asserted while the control signal 'SH1' is still asserted.

Advantageously, the settling and sampling time required for each acquired image signal sample in an SH circuitry 230 configuration having two SH branches may be half that required for settling and sampling in a non-branched SH circuitry, due to the respective capacitors of each SH branch 240, 250 being half the size required for the non-branched SH circuitry. Similarly, the settling and sampling time required for each acquired image signal sample in an SH circuitry 230 configuration having four SH branches may be a quarter that required for settling and sampling in a non-branched SH circuitry. Consequently, image signal sample acquisition in a multi-branch SH circuitry 230 requires no additional time compared to a single sample in a non-branched SH circuitry.

The staggered sampling provides sufficient space between the sampling events to allow for uncorrelation of noise between the image samples, while taking no additional time compared to a sampling just a single image value in a non-branched SH circuitry. Furthermore, in a non-branched SH circuitry, a second sampling of the image signal, separated by $T_{CMS}$, would be required for CMS2 in the non-branched case. An SH circuitry 230 having two SH branches 280, 285 and performing a CMS2 read therefore saves a time period $T_{CMS}$ compared to the non-branched case when taking two image samples, and an SH circuitry 230 having four SH branches and performing a CMS4 read therefore saves $3\times T_{CMS}$ compared to the non-branched case when taking four image samples. These time savings improve the frame rate of the image sensor 100. Furthermore, the staggered image signal samples in a multi-branch SH circuitry 230 also improves digital correlated double sampling (DCDS) due to better correlation of low frequency flicker components.

During the image signal time period 410 and after storing the image signal samples and third and fourth times 440, 445, the first and second image samples may be averaged at the SH circuitry output 234 as described above, and the ADC 200 may begin 450 performing the SA algorithm. As described above, the ADC control circuitry 270 or other suitably control circuitry may control the DACs 280, 285 to successively switch the respective arrays of switched capacitors to converge on a digital representation based on the multiple sampled image signal values from the third and fourth times 440, 445. Upon completion 455 of the SA algorithm, the digital representation of the image value may be stored or otherwise provided by the ADC 200.

According to the CMS process illustrated by the timing diagram 400, the ADC 200 acquires and averages multiple samples of the reset signal from the pixel 120 and the image signal from the pixel 120, and provides a digital representation of the reset signal (as a digital reset value) and the image signal (as a digital image value). The image sensor 100, for example via the readout circuitry 150, may then subtract the digital reset value from the digital image value to obtain a final pixel value for the pixel 120, having reduced noise and accounting for the reset voltage level.

The timing diagram of FIG. 4 is merely illustrative, and any suitable modification may be made to the timing diagram. For example, the timing diagram 400 may be adapted to an SH circuitry 230 having 3, 4, or more SH branches, for example for use with the four-branch SH circuitry 230 illustrated by FIG. 3. As discussed above, additional reset samples can be acquired at additional $T_{CMS}$ intervals, and additional image samples can be acquired in a staggered manner. Additionally, the image signals may be acquired prior to the reset samples as desired.

Therefore, implementations of an ADC 200 having a two-branch SH circuitry 230 according to the description herein perform analog CMS2 without any additional area required for capacitors, provide better DCDS flicker noise cancellation, and take less time compared to other digital and analog CMS techniques that require additional capacitors or capacitor area, extra $T_{CMS}$, and lesser DCDS flicker cancellation. These benefits extend to implementations of the SH circuitry 230 having more than two SH branches, for example as illustrated in FIG. 3.

As described above, with each SH branch of the SH circuitry 230 sampling a reset or image signal and each respective DACs participating in the AD conversion, the ADC 200 may provide a unitary gain. Advantageously, the systems and methods described herein further provide for selectable gain in the ADC 200 through appropriate control of the ADC 200.

Figure 5:
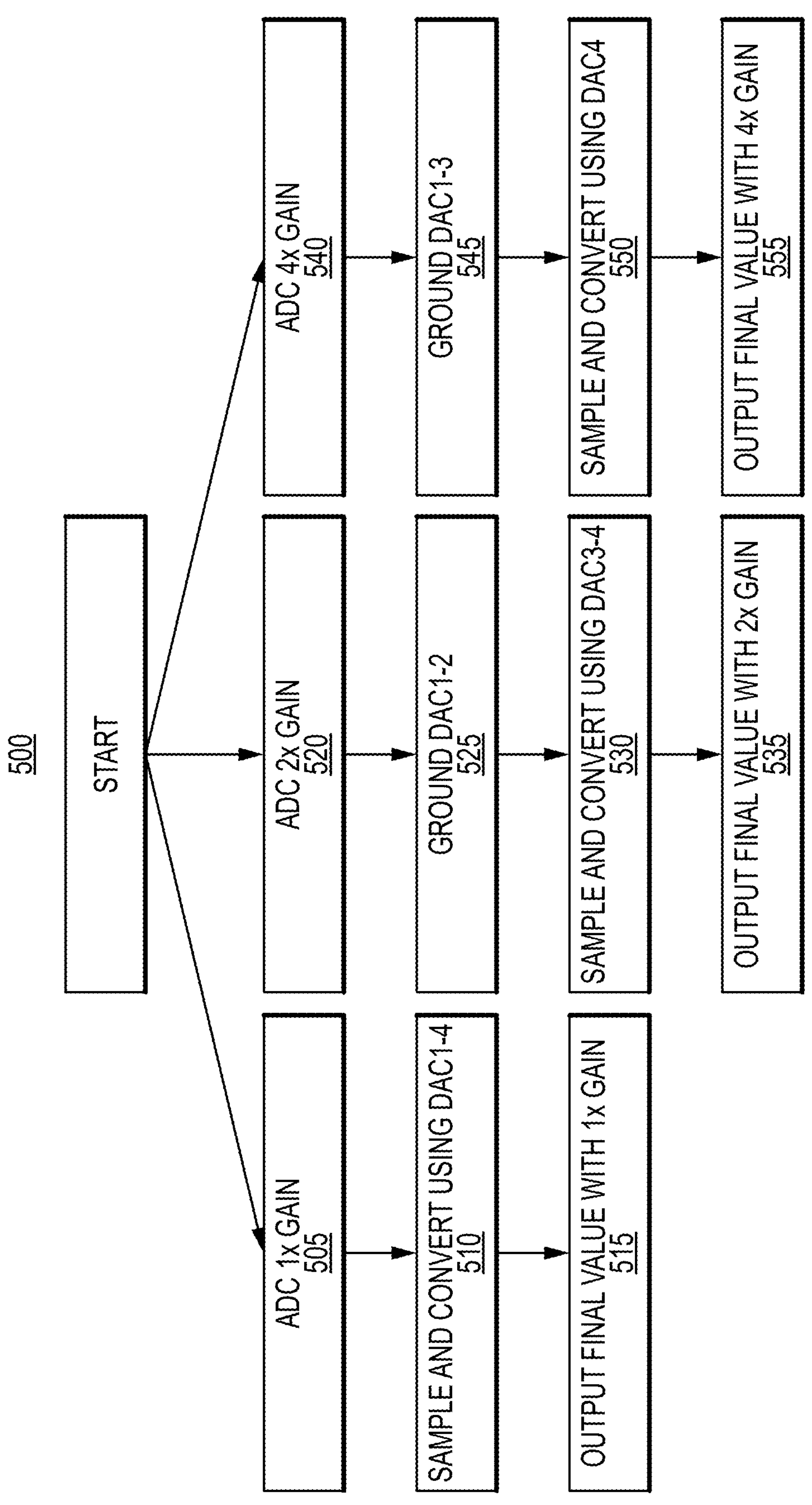
FIG. 5 is a flowchart for an illustrative method of operating an exemplary ADC according to a selected gain mode, according to various embodiments.

FIG. 5 illustrates an exemplary gain selection method 500 for implementing a selectable gain via the ADC 200 for a four-branch SH circuitry 230, such as described with respect to FIG. 3. At step 505, a unitary gain (1× gain) may be selected for the ADC 200. At step 510, the sampling and conversion described above may proceed, for example using each of the SH branches 240, 250, 300, 310 and the corresponding DACs 280, 285, 320, 330 to sample and AD convert the four sampled reset signal values and four sampled image signal values as described with respect to FIGS. 3 and 4. At step 515, the readout circuitry 150 may then determine the final pixel value having unitary gain in the ADC 200 by subtracting the unitary gain digital image value from the unitary gain digital reset value. Note that other gains may be present in the column 155 signal chain, for example gains due to conversion gain options in the pixel 120, gain from the source follower transistor 215, gain from the amplifier 225, and/or the like.

At step 520, a gain of 2 (2× gain) may be selected for the ADC 200. At step 525, half of the DACs coupled with the SH circuitry 230 may be AC grounded. For example, in a four-branch SH circuitry 230 such as illustrated in FIG. 3, the first DAC 280 and the second DAC 285 may be AC grounded. The bottom plates of the first and second DACs 280, 285 may be kept AC grounded, such that they do not participate in the conversion process. When one or more of the DACs are AC grounded, for the same change at the SH circuitry output 234, the effective reference for the non-grounded DACs is reduced, thereby increasing gain. When half of the DACs are AC grounded, the gain doubles.

At step 530, the sampling and conversion may proceed, however with only the non-grounded DACs participating in the AD conversion. For example, the 2× gain ADC mode selected at step 520 may use two of the four SH branches, for example SH branches 300, 310 and the corresponding DACs 320, 330 to sample and AD convert the sampled reset signal and image signal values. In some embodiments, the sampling signals 'SH1,' 'SH2,' 'SH3,' 'SH4' may remain the same, with the number of DACs 280, 285, 320, 330 participating in the conversion process being changed. At step 535, the readout circuitry 150 may then determine the final pixel value having 2× gain by subtracting the 2× gain digital image value from the 2× gain digital reset value.

At step 540, a gain of 4 (4× gain) may be selected for the ADC 200. At step 545, three of four DACs coupled with the SH circuitry 230 may be AC grounded. For example, in a four-branch SH circuitry 230 such as illustrated in FIG. 3, the first DAC 280, second DAC 285, and third DAC 320 may be AC grounded. When three of the four DACs are grounded, the gain may be quadrupled. At step 550, the sampling and conversion may proceed, however with only the non-grounded DAC(s) participating in the AD conversion. For example, the 4× gain ADC mode selected at step 540 may use one of the four SH branches, for example SH branch 310 and the corresponding DAC 330 to sample and AD convert the sampled reset signal and image signal values. At step 555, the readout circuitry 150 may then determine the final pixel value having 4× gain by subtracting the 4× gain digital image value from the 4× gain digital reset value.

In some embodiments, a higher gain in the ADC 200, for example 2× gain or 4× gain, may be chosen for readout operations from the pixel 120 requiring a higher gain, for example during high or medium conversion gain readouts from the pixel 120. The higher gain ADC mode provides improved sensitivity to low light during high conversion gain reads, with reduced ADC quantization noise. In some embodiments, a lower gain in the ADC 200, for example 1× gain, may be chosen for readout operations from the pixel 120 not requiring a higher gain, for example during a low conversion gain readout from the pixel 120. The lower or unitary gain ADC mode maintains the dynamic range in low conversion gain reads.

Various embodiments therefore provide systems, devices, and methods that can perform analog CMS readout and conversion having an improved framerate. In addition, with reference to an exemplary four-branch SH circuitry 230 as illustrated in FIG. 3, the selectable combinations of SH1, SH2, SH3, SH4, and DAC1, DAC2, DAC3, DAC4, provide selectable ADC Gains of 1×, 2×, 4× and CMS2, CMS4. The ADC 200 architecture described herein is further scalable to additional or fewer SH branches, as needed. Unlike digital CMS techniques, scaling of the ADC 200 as described herein only requires the time between reset samples to increase ($T_{CMS}$), but does not require any additional AD conversions. These features and advantages are provided with minimal additional complexity or active circuitry in the ADC 200.

Exemplary embodiments provide improved low noise and/or high-speed image sensors. In some cases, read noise may be reduced by greater than 30%. Furthermore, in some cases, the analog CMS systems and methods described herein provide lower power requirements compared to digital CMS systems and methods for the same or less noise. For example, implementing the analog CMS systems and methods described herein may provide for an exemplary power savings of approximately 50 mW, which may be approximately 10% of overall chip power for modern image sensors. Exemplary systems and methods additional provide higher frame rate compared to digital CMS techniques, for example a greater than 30% framerate improvement in high conversion gain readout (e.g., using a gained SH circuitry 230), and a 10% increase in overall framerate. Systems and methods according to various embodiments may be used as a time and power saving replacement to traditional analog or digital CMS techniques.

The various components and functions shown and described in the readout circuitry 150 and ADC 200, and control thereof such as according to the processes of FIGS. 4 and 5, may be distributed amongst the various components of the image sensor 100 in any suitable manner, and different embodiments may organize the processing of various features and information in any number of different ways. Several of the various features and systems described herein may be implemented in software and/or firmware that resides in non-transitory data storage for execution by one or more processors to perform the various (automated) processes described herein.

It should be noted the arrangement of the image sensor 100, pixel 120, and readout circuitry 150 described herein is merely illustrative. In general, any desired image sensor circuitry and/or systems may be used with the ADC 200 circuitry shown in connection with FIGS. 2 and 3. Additionally, the circuitry and methods described herein for performing AD conversion using exemplary ADC 200 circuitry may be used in conjunction with any number of systems and methods, and is not limited to use in conjunction with image or other optical sensors.

It will be recognized that circuitry described herein may alternatively or additionally be implemented as computer instructions (software, firmware, or the like) configured to cause a processor to perform the functions of the described circuitry. It will also be recognized that computer instructions described herein may alternatively or additionally be implemented as hardware circuitry operable to perform the functions of the described computer instructions.

As used herein, a node or electrical node may be a point in an electrical network where two or more components are interconnected, enabling the transfer of electrical signals, power, and/or the like. Various components may be coupled when they are electrically interconnected, whether directly or indirectly (e.g., through intermediary components). According to some embodiments, binary signals may be asserted or de-asserted, which may include changing the binary state of the signal from one of two possible states to the other state. Asserting a binary signal may include setting it to the equivalent of a logic high or low state, depending on design choices.

The general concepts set forth herein may be adapted to any number of alternate but equivalent embodiments. The term "exemplary" is used herein to represent one example, instance or illustration that may have any number of alternates. Any implementation described herein as "exemplary" is not necessarily to be construed as preferred or advantageous over other implementations, nor is it necessarily intended as a model that must be duplicated in other implementations. While several exemplary embodiments have been presented in the foregoing detailed description, it should be appreciated that a vast number of alternate but equivalent variations exist, and the examples presented herein are not intended to limit the scope, applicability, or configuration of the invention in any way. To the contrary, various changes may be made in the function and arrangement of elements described without departing from the scope of the claims and their legal equivalents.

What is claimed is:

1. An image sensor, comprising:
- a pixel comprising an output; and
- a readout circuitry coupled to the pixel output, wherein the readout circuitry comprises:
  - an amplifier having an input and an output, wherein the input is coupled with the pixel output; and
  - an analog-to-digital converter (ADC) comprising:
    - a sample and hold (SH) circuitry comprising an input, an output, a first SH branch coupled between the SH circuitry input and the SH circuitry output, and a second SH branch coupled in parallel with the first SH branch between the SH circuitry input and the SH circuitry output, wherein:
      - the SH circuitry input is coupled with the amplifier output; and
      - the SH circuitry output is configured to determine a combined value based on the first SH branch and second SH branch;
    - a first digital-to-analog converter (DAC) coupled with the first SH branch; and
    - a second DAC coupled with the second SH branch.

2. The image sensor of claim 1, wherein:
- the ADC comprises a third DAC and a fourth DAC; and
- the SH circuitry comprises a third SH branch and a fourth SH branch, wherein:
  - the first SH branch, second SH branch, third SH branch, and fourth SH branch are coupled in parallel between the SH circuitry input and the SH circuitry output;
  - the SH circuitry output is configured to determine the combined value based on the first SH branch, second SH branch, third SH branch, and fourth SH branch;
- the third DAC is coupled with the third SH branch; and
- the fourth DAC is coupled with the fourth SH branch.

3. The image sensor of claim 1, wherein:
- the first SH branch comprises a first switch coupled, at a first node, in series with a first capacitor, wherein the first DAC is coupled with the first SH branch at the first node; and
- the second SH branch comprises a second switch coupled, at a second node, in series with a second capacitor, wherein the second DAC is coupled with the second SH branch at the second node.

4. The image sensor of claim 1, wherein the ADC comprises:
- a comparator comprising a first input, a second input, and an output, wherein:
  - the comparator is configured to provide a comparison result on the comparator output; and
  - the comparison result is based on the first input and the second input; and
- an ADC control circuitry comprising an input and an output, wherein:
  - the ADC control circuitry input is coupled with the comparator output; and
  - the ADC control circuitry is configured to control the first DAC and the second DAC via the ADC control circuitry output.

5. The image sensor of claim 4, wherein:
- the comparator second input is coupled with a reference signal;
- the comparator is configured to compare the reference signal to the combined value; and
- the ADC control circuitry is configured to control the first DAC and the second DAC according to a successive approximation (SA) algorithm.

6. The image sensor of claim 5, wherein:
- the first DAC comprises a first plurality of switched capacitors;
- the second DAC comprises a second plurality of switched capacitors;
- the ADC control circuitry is configured to switch the first plurality of switched capacitors and switch the second plurality of switched capacitors according to the SA algorithm; and
- the ADC is configured to provide a digital representation of the SH circuitry input based on one or more comparison results provided by the comparator.

7. The image sensor of claim 1, wherein the image sensor is configured to:
- control the first SH branch to store, at a first time, a first reset value;
- control the second SH branch to store, at a second time, a second reset value;
- perform, using the ADC, a first analog-to-digital (AD) conversion of a first combined value to generate a digital reset value, wherein the first combined value is based on the first and second reset values;
- control the first SH branch to store, at a third time, a first image value;
- control the second SH branch to store, at a fourth time, a second image value;
- perform, using the ADC, a second AD conversion of a second combined value to generate a digital image value, wherein the second combined value is based on the first and second image values; and
- determine a final pixel value based on the digital image value and the digital reset value.

8. The image sensor of claim 7, wherein:
- the second time is a time period $T_{CMS}$ after the first time, wherein the time period $T_{CMS}$ corresponds to a minimum time required to provide an uncorrelation of noise; and
- the fourth time is the time period $T_{CMS}$ after the third time.

9. A method for performing a readout of an image sensor pixel using an analog-to-digital converter (ADC), comprising:

storing, at a first time and using a first sample and hold (SH) branch of an SH circuitry, a first reset value based on a first output of the pixel;

storing, at a second time and using a second SH branch of the SH circuitry, a second reset value based on the first output, wherein:

the first SH branch is coupled in parallel with the second SH branch between an input of the SH circuitry and an output of the SH circuitry; and the SH circuitry output provides a combined value based on the first SH branch and the second SH branch;

performing, using the ADC, a first analog-to-digital (AD) conversion of a first combined value from the SH circuitry output to generate a digital reset value;

storing, at a third time and using the first SH branch, a first image value based on a second output of the pixel;

storing, at a fourth time and using the second SH branch, a second image value based on the second output;

performing, using the ADC, a second AD conversion of a second combined value from the SH circuitry output to generate a digital image value; and determining a final pixel value based on the digital reset value and the digital image value.

10. The method of claim 9, further comprising:

storing, at a fifth time and using a third SH branch of the SH circuitry, a third reset value based on the first output;

storing, at a sixth time and using a fourth SH branch of the SH circuitry, a fourth reset value based on the first output;

storing, at a seventh time and using the third SH branch, a third image value based on the second output;

storing, at an eight time and using the fourth SH branch, a fourth image value based on the first output, wherein:

the first, second, third, and fourth SH branches are coupled in parallel between the input of the SH circuitry and the output of the SH circuitry; and the SH circuitry output provides the combined value based on the first SH branch, second SH branch, third SH branch, and fourth SH branch.

11. The method of claim 9, wherein the ADC comprises a first digital-to-analog converter (DAC) coupled with the first SH branch and a second DAC coupled with the second SH branch, and wherein:

performing the first AD conversion comprises concurrently controlling the first DAC and the second DAC; and performing the second AD conversion comprises concurrently controlling the first DAC and the second DAC.

12. The method of claim 11, wherein performing each AD conversion comprises performing, by the ADC, a successive approximation (SA) algorithm.

13. The method of claim 12, wherein:

the first DAC comprises a first array of switched capacitors;

the second DAC comprises a second array of switched capacitors;

controlling the first DAC comprises switching the first array of switched capacitors according to the SA algorithm; and controlling the second DAC comprises switching the second array of switched capacitors according to the SA algorithm.

14. The method of claim 9, wherein determining the final pixel value comprises subtracting the digital reset value from the digital image value.

15. The method of claim 9, wherein the second time is a time period $T_{CMS}$ after the first time, wherein the time period $T_{CMS}$ corresponds to a minimum time required to provide an uncorrelation of noise.

16. The method of claim 15, wherein the fourth time is the time period $T_{CMS}$ after the third time.

17. An analog-to-digital converter (ADC), comprising:

a sample and hold (SH) circuitry comprising an input, an output, a first SH branch coupled between the SH circuitry input and the SH circuitry output, and a second SH branch coupled in parallel with the first SH branch between the SH circuitry input and the SH circuitry output, wherein:

the SH circuitry input is coupled with an input of the ADC; and the SH circuitry output is configured to determine a combined value based on the first SH branch and second SH branch;

a first digital-to-analog converter (DAC) coupled with a sample hold node of the first SH branch; and a second DAC coupled with a sample hold node of the second SH branch.

18. The ADC of claim 17, further comprising:

a comparator comprising a first input, a second input, and an output, wherein:

the comparator is configured to provide, on the comparator output, a comparison result based on the first and second comparator inputs; and an ADC control circuitry comprising an input and an output, wherein:

the ADC control circuitry input is coupled with the comparator output; and the ADC control circuitry is configured to control the first DAC and the second DAC via the ADC control circuitry output.

19. The ADC of claim 18, wherein the ADC control circuitry is configured to control the first DAC and the second DAC according to a successive approximation (SA) algorithm.

20. The ADC of claim 19, wherein:

the first DAC comprises a first plurality of switched capacitors;

the second DAC comprises a second plurality of switched capacitors;

the ADC control circuitry is configured to switch the first plurality of switched capacitors and switch the second plurality of switched capacitors according to the SA algorithm; and the ADC is configured to provide a digital representation of the SH circuitry input based on one or more comparison results provided by the comparator.

* * * * *